US011870000B2

United States Patent
McGarvey

(10) Patent No.: US 11,870,000 B2
(45) Date of Patent: Jan. 9, 2024

(54) SEMICONDUCTOR PACKAGES WITH SINGLE-PHOTON AVALANCHE DIODES AND PRISMS

(71) Applicant: SEMICONDUCTOR COMPONENTS INDUSTRIES, LLC, Phoenix, AZ (US)

(72) Inventor: Brian Patrick McGarvey, Templemartin (IE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 330 days.

(21) Appl. No.: 16/949,845

(22) Filed: Nov. 17, 2020

(65) Prior Publication Data

US 2022/0158019 A1  May 19, 2022

(51) Int. Cl.
*H01L 31/107* (2006.01)
*H01L 27/146* (2006.01)
*H01L 31/0232* (2014.01)

(52) U.S. Cl.
CPC ...... *H01L 31/107* (2013.01); *H01L 27/14603* (2013.01); *H01L 27/14609* (2013.01); *H01L 27/14625* (2013.01); *H01L 27/14643* (2013.01); *H01L 31/02325* (2013.01)

(58) Field of Classification Search
CPC ............. H01L 31/02325; H01L 31/107; H01L 27/14603; H01L 27/14609; H01L 27/14625; H01L 27/14643; H01L 25/042
See application file for complete search history.

(56) References Cited

U.S. PATENT DOCUMENTS

| 2008/0165257 A1 | 7/2008 | Boettiger et al. |
| 2010/0260460 A1* | 10/2010 | Harrysson ............ H01Q 1/1271 343/702 |
| 2011/0198503 A1 | 8/2011 | Koren et al. |
| 2011/0240865 A1 | 10/2011 | Frach et al. |
| 2013/0153975 A1 | 6/2013 | Henseler et al. |
| 2013/0313414 A1 | 11/2013 | Pavlov et al. |
| 2016/0181459 A1 | 6/2016 | Birk et al. |
| 2021/0091251 A1* | 3/2021 | Onal ...................... G01S 17/894 |
| 2021/0280727 A1* | 9/2021 | Jung ...................... C09K 11/02 |

OTHER PUBLICATIONS

R. H. Rasshofer et al. "Automotive Radar and Lidar Systems for Next Generation Driver"; Assistance Functions Advances in Radio Science, 3, 205-209, 2005.

* cited by examiner

*Primary Examiner* — Brigitte A Paterson
(74) *Attorney, Agent, or Firm* — Treyz Law Group, P.C.; Joseph F. Guihan

(57) ABSTRACT

A semiconductor package may include a line array of single-photon avalanche diodes (SPADs). The line array of single-photon avalanche diodes may be split between multiple silicon dice. The silicon dice may have a staggered arrangement, with prisms on the package lid redirecting incident light to the silicon dice. The silicon dice may alternate between a first side of the package substrate and a second side of the package substrate. The prisms may alternate between a first structure that redirects incident light to the first side of the package substrate and a second structure that redirects incident light to the second side of the package substrate. The silicon dice may overlap to allow satisfactory alignment between the silicon dice and the prisms.

18 Claims, 8 Drawing Sheets

SEMICONDUCTOR PACKAGES WITH SINGLE-PHOTON AVALANCHE DIODES AND PRISMS

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. Single-photon avalanche diodes may be capable of single-photon detection.

It is within this context that the embodiments described herein arise.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices, on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
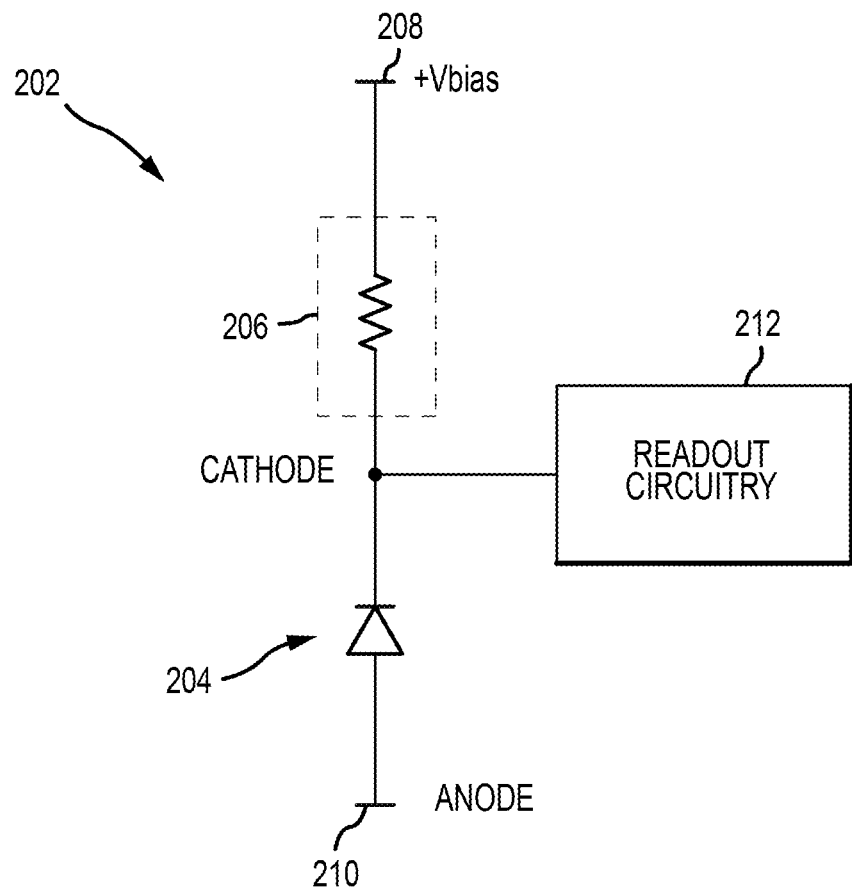
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply voltage terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208). Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to terminal 208 or any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
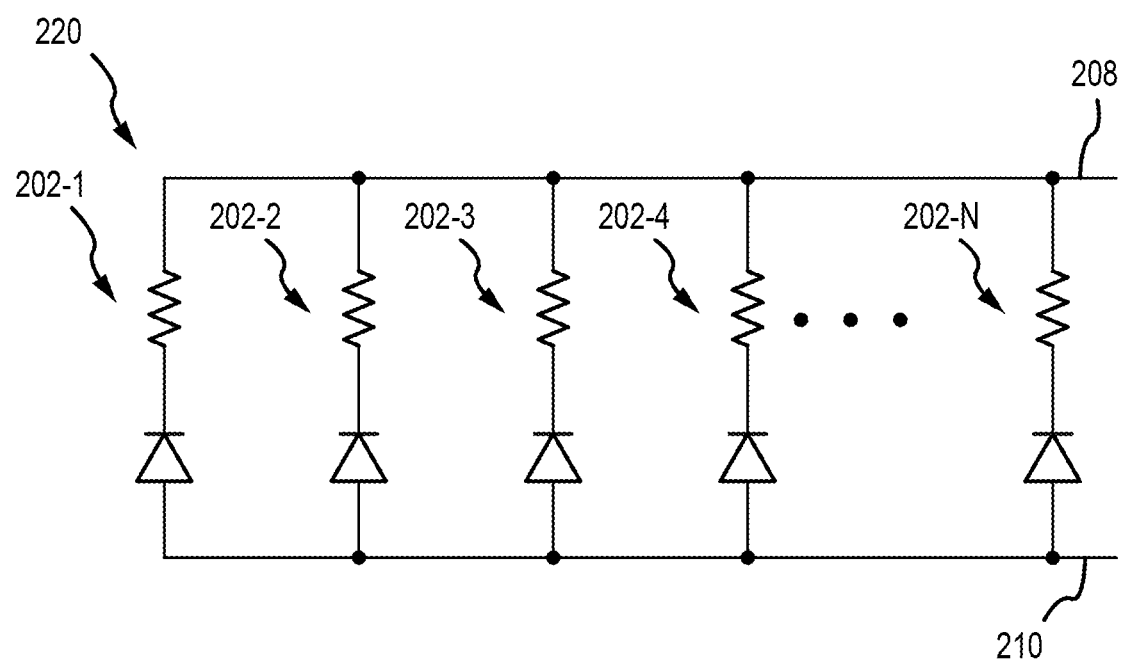
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier 220.

Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
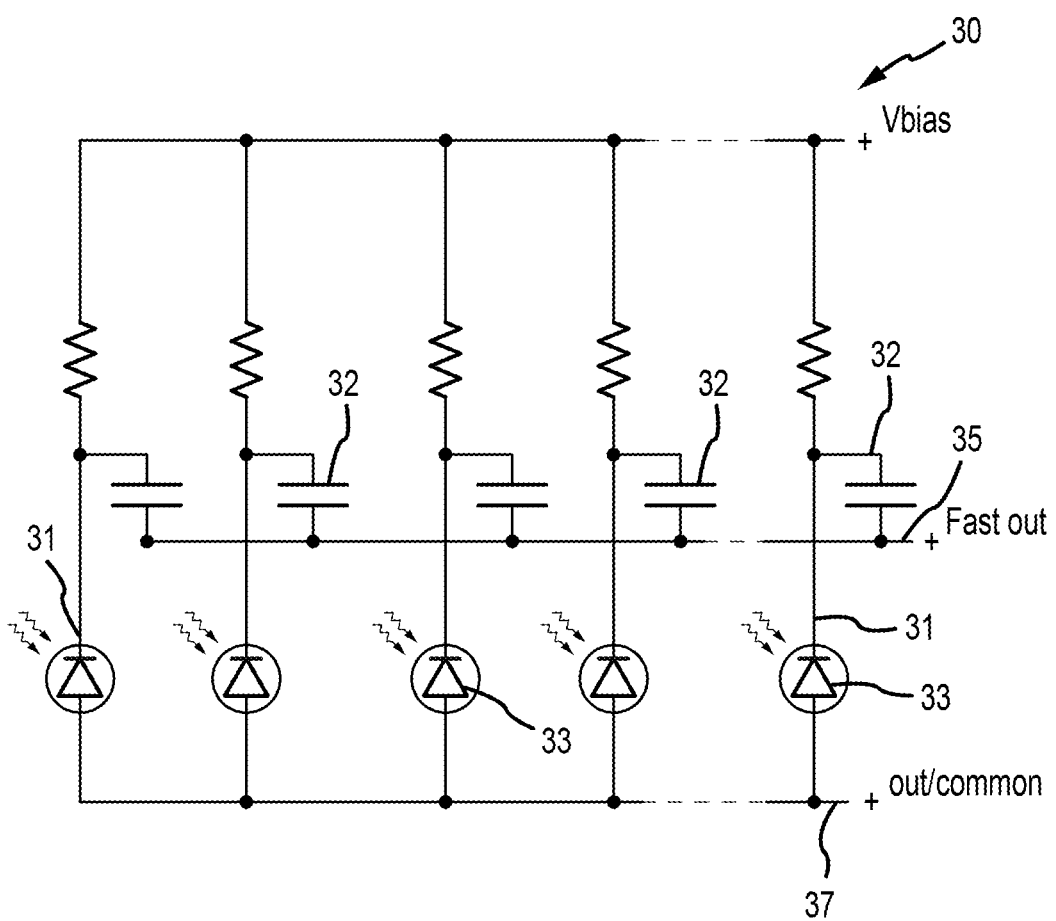
FIG. 3 is a schematic diagram of an illustrative silicon photomultiplier with a fast output terminal in accordance with an embodiment.

FIG. 3 illustrates a silicon photomultiplier 30. As shown in FIG. 3, SiPM 30 has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
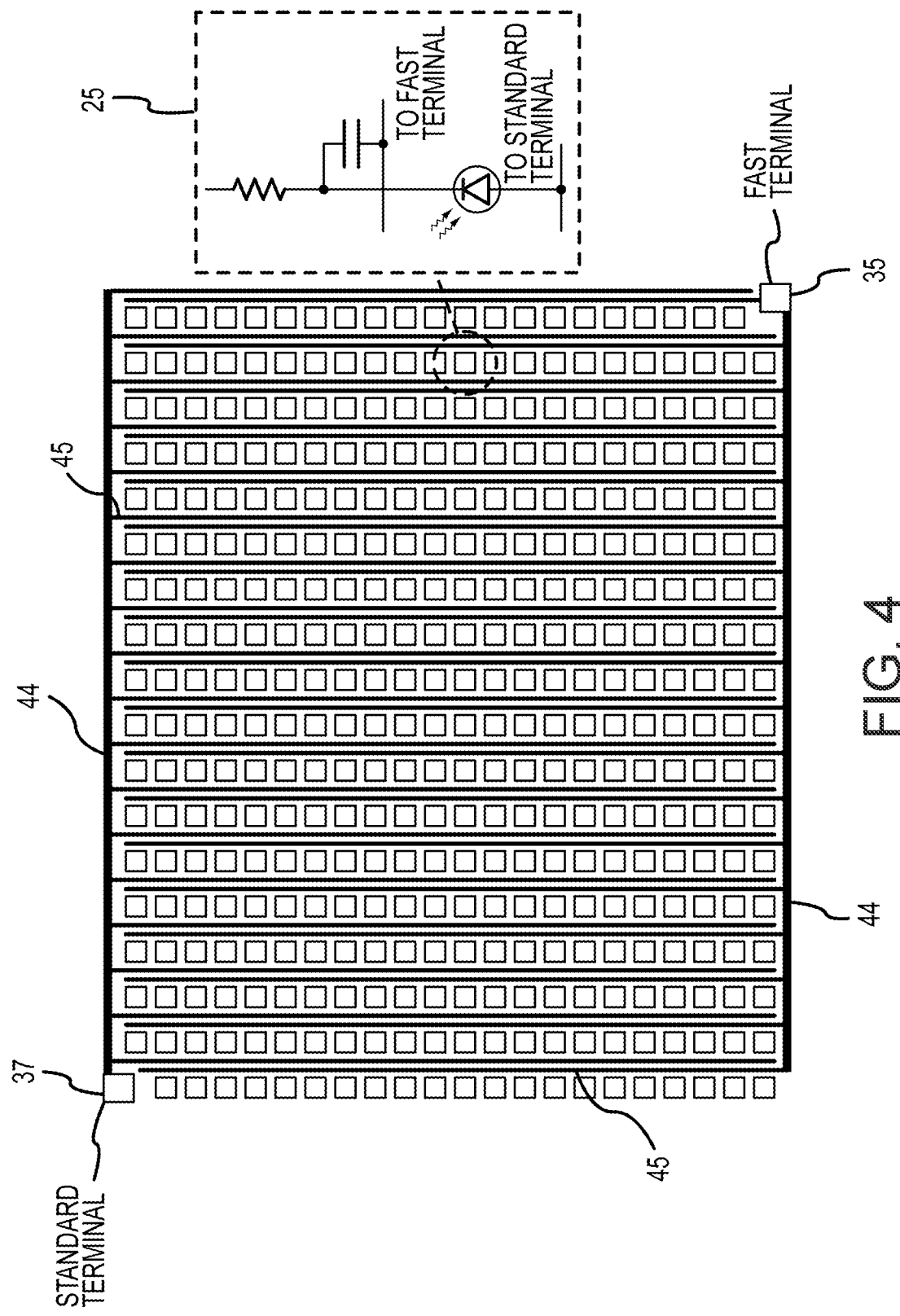
FIG. 4 is a diagram of an illustrative silicon photomultiplier comprising an array of microcells.

It will be appreciated by those skilled in the art that silicon photomultipliers include major bus lines 44 and minor bus lines 45 as illustrated in FIG. 4. The minor bus liens 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
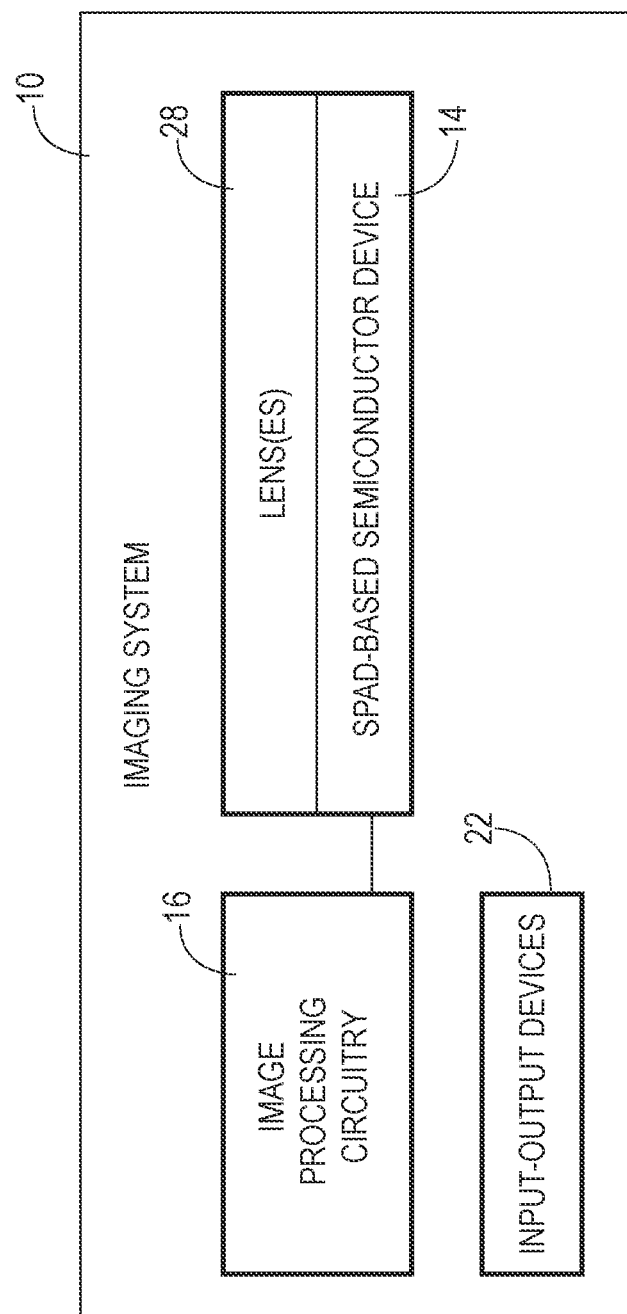
FIG. 5 is a schematic diagram of an illustrative imaging system that includes a SPAD-based semiconductor device in accordance with an embodiment.

An imaging system 10 with a SPAD-based semiconductor device is shown in FIG. 5. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system may be used for LIDAR applications.

Imaging system 14 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more). In some SPAD-based semiconductor devices, each SPAD pixel may be covered by a respective color filter element and/or microlens.

The SPAD-based semiconductor device 14 may optionally include additional circuitry such as logic gates, digital counters, time-to-digital converters, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component (such as a laser) may be included in the imaging system to emit light (e.g., infrared light or light of any other desired type). Semiconductor device 14 may measure the reflection of the light off of an object to measure distance to the object in a LIDAR (light detection and ranging) scheme.

As previously mentioned, in some cases a semiconductor device including single-photon avalanche diodes may be arranged in a line array (e.g., an array having a single row and multiple columns or a single column and multiple rows). Having line arrays with a high aspect ratio may be advantageous for scanning LIDAR applications.

Figure 6:
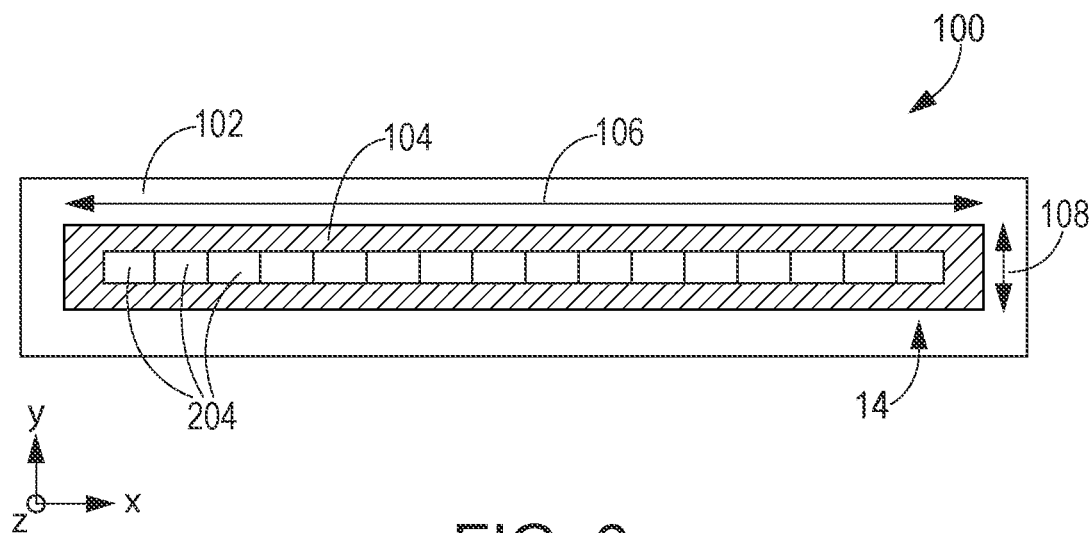
FIG. 6 is a top view of an illustrative semiconductor package that includes a line array of single-photon avalanche diodes in a single semiconductor die in accordance with an embodiment.

FIG. 6 is a top view of an illustrative semiconductor device package 100 that includes a high aspect ratio silicon photomultiplier. As shown, package 100 includes a SPAD-based semiconductor device 14 that is mounted to a package substrate 102. Package substrate 102 (sometimes referred to as package carrier 102) may be formed from ceramic, an organic laminate, or any other desired material. The SPAD-based semiconductor device 14 may include a semiconductor die 104 formed from a semiconductor material such as silicon. The silicon die 104 includes a plurality of single-photon avalanche diodes 204 arranged in a line (e.g., an array having a single row and multiple columns). The SPADs 204 are formed from doped portions of the silicon die.

The semiconductor die 104 may be attached to package substrate 102 using any desired techniques. For example, wire bonding, through-silicon vias (TSVs), or any other desired techniques may be used for attaching the die to the package substrate.

Increasing the aspect ratio of the line array formed using SPAD-based semiconductor device 14 may improve scanning LIDAR performance (e.g., by increasing the resolution of the device). In FIG. 6, a 1×16 array of SPADs is included in SPAD-based semiconductor device 14. The silicon die 104 that is used to form the 1×16 array of SPADs may have corresponding dimensions that are needed in order to provide sufficient room for the SPADs. In FIG. 6, silicon die 104 has a length 106 and a width 108. The aspect ratio of the silicon die may be defined by the length divided by the width.

In FIG. 6, width 108 may be less than 3 millimeters, less than 2 millimeters, less than 1 millimeter, greater than 0.5 millimeters, between 0.1 and 5 millimeters, etc. Length 106 may be greater than 5 millimeters, greater than 8 millimeters, greater than 10 millimeters, less than 12 millimeters, less than 10 millimeters, between 6 and 12 millimeters, etc. The aspect ratio of semiconductor die 104 may be greater than 3, greater than 4, greater than 5, greater than 6, less than 6, etc. In one illustrative example, the width 108 is between 2 and 3 millimeters while the length 106 is between 9 and 11 millimeters. The aspect ratio is therefore approximately between 3 and 5.5.

There may be a desire to have line arrays having even larger aspect ratio. For example, instead of a 1×16 array of SPADs, it may be desirable for the semiconductor package to include a 1×32 array of SPADs, 1×64 array of SPADs, 1×128 array of SPADs, etc. As the aspect ratio of the SPAD array increases, the aspect ratio of the silicon die used to provide the SPAD array also increases. Consider the example of a 1×64 array of SPADs. The semiconductor die used to provide this array may have the same width 108 as in FIG. 6 (e.g., between 2 and 3 millimeters). However, the length of the semiconductor die may be about four times greater than the length 106 in FIG. 6. The length of the semiconductor die for a 1×64 SPAD array may be between 30 and 40 millimeters. The aspect ratio of the silicon die for a 1×64 SPAD array is therefore between 10 and 20.

Providing silicon dice with such a high aspect ratio may have corresponding manufacturing challenges. Silicon dice having high aspect ratios may be delicate and susceptible to breaking during manufacturing. For example, the manufacturing equipment used to pick and place silicon dice may break silicon dice having such high aspect ratios. Specialized manufacturing equipment may potentially be used to handle high aspect ratio silicon dice. However, this may result in high costs and complexity for the manufacturing process.

To achieve a high aspect ratio SPAD array while maintaining silicon dice that are easy to manufacture and manipulate, the SPAD-based semiconductor device may be formed from multiple lower-aspect-ratio silicon dice instead of one high-aspect-ratio silicon die. The semiconductor package may be designed to minimize the impact of any gaps between silicon dice.

Figure 7:
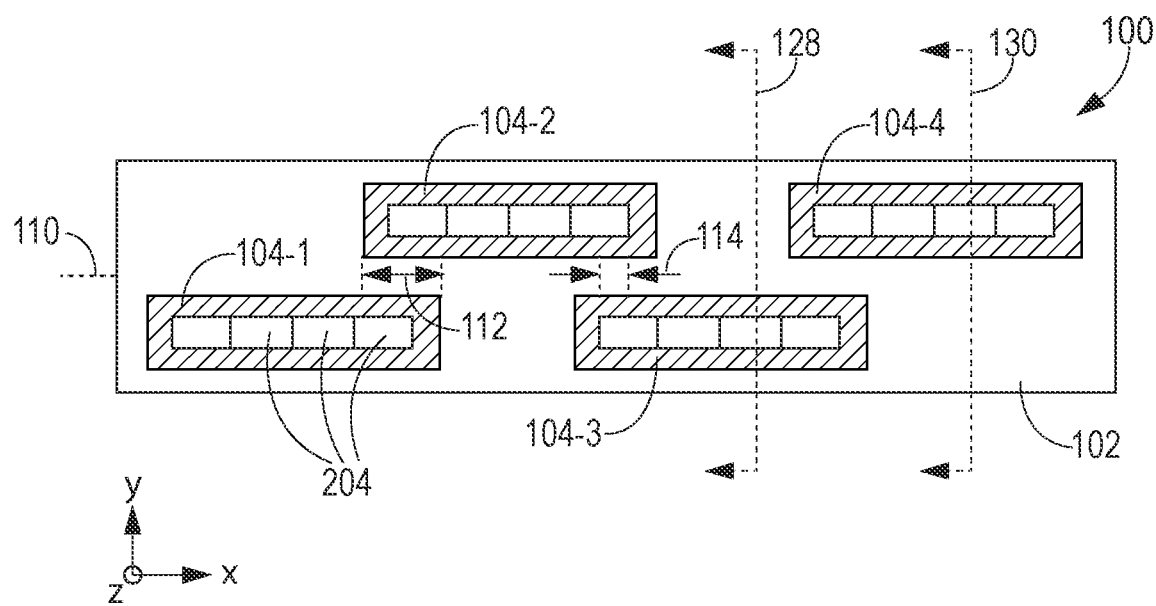
FIG. 7 is a top view of an illustrative semiconductor package that includes a line array of single-photon avalanche diodes split between multiple semiconductor dice in a staggered arrangement in accordance with an embodiment.

FIG. 7 is a top view of an illustrative semiconductor package that includes multiple silicon dice each having a respective sub-array of single-photon avalanche diodes. In the example of FIG. 7, silicon dice 104-1, 104-2, 104-3, and 104-4 are mounted on package substrate 102. The silicon dice may each include a subset of the overall SPAD array. In the example of FIG. 7, each silicon die includes a respective 1×4 SPAD array. Package 100 therefore includes a 1×16 SPAD line array made up 4 respective sub-arrays.

The specific array lengths depicted in FIG. 7 are merely illustrative. In general, package 100 may include any desired number of silicon dice (e.g., two, three, four, four or more, six or more, eight or more, twelve or more, sixteen or more, thirty-two or more, etc.). Each silicon die may include a line array of 1×n SPADs, where n is equal to any positive integer. Each die may include only 1 SPAD in one possible embodiment. Each die may include 2 SPADs, 3 SPADs, 4 SPADs, 4 or more SPADs, 8 or more SPADs, 10 or more SPADs, less than 20 SPADs etc. In general, each die may include sufficiently few SPADs to allow the die to have a sufficiently small aspect ratio to remain robust during manufacturing. Above some limit of SPADs, the dice may be susceptible to breaking during manufacturing as discussed above. Therefore, the dice may include a number of SPADs that does not exceed the aforementioned limit. In FIG. 7, each silicon die includes the same number of SPADs. However, different dice in a single package may include different number of SPADs if desired.

To mitigate discontinuity in the SPAD array formed by the multiple silicon dice in FIG. 7, the silicon dice may have a staggered arrangement. As shown, package 100 may have a centerline 110 that extends through the center of the package in a direction parallel to the SPAD array (e.g., parallel to the X-axis). The dice may alternately be positioned on opposing sides of the centerline. For example dice 104-1 and 104-3 are positioned below the centerline (on one side of the package substrate) whereas dice 104-2 and 104-4 are positioned above the centerline (on the other side of the package substrate).

To ensure each die receives incident light with the staggered arrangement of FIG. 7, one or more prisms may be included to redirect light to the appropriate area of the package over each die. For example, over die 104-1, a prism is shaped to direct light to the footprint of the package occupied by die 104-1. Over die 104-2, a prism is shaped to direct light to the footprint of the package occupied by die 104-2. Example prisms structures are shown in more detail in FIGS. 8A, 8B, and 9.

Proper alignment between the silicon dice in package 100 and the overlying prisms that redirect light to the dice is important to ensure satisfactory sensing performance. To account for manufacturing tolerance in the positioning of the prisms relative to the silicon dice, the silicon dice may overlap as shown in FIG. 7. The silicon dice have overlap 112 in the Y-direction (e.g., perpendicular to the direction in which the SPAD array extends). This overlap may negate any alignment issues between the silicon dice and the prisms.

As a specific example, the prisms may be positioned with a tolerance of 50 microns during manufacturing. Making each SPAD sub-array slightly longer and wider (e.g., adding 100 microns to the length and width) may ensure that there are no alignment issues between the SPAD sub-arrays and the prisms. The staggered arrangement of FIG. 7 allows for overlap 112, which is used to negate alignment issues.

It should be noted that, if desired, the SPADs 204 on the ends of each sub-array may be made longer than the central SPADs of each sub-array. Having the edge SPADs be longer in this way allows for misalignment tolerance without adverse effects of array performance. Both the silicon dice and the SPAD arrays themselves may overlap in the Y-direction. The overlap amount 114 between the SPAD sub-arrays in the Y-direction may be 50 microns (in the example where the prisms have 50 microns of tolerance) or any other desired amount.

Figure 8A:
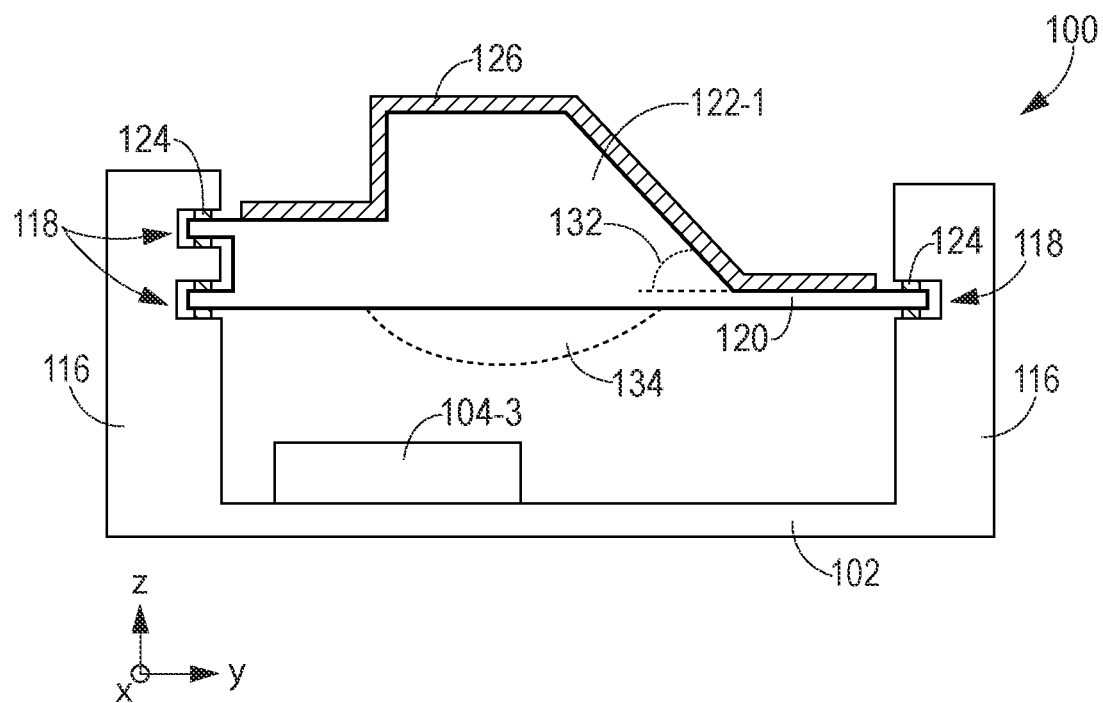
FIGS. 8A and 8B are cross-sectional side views of an illustrative semiconductor package of the type shown in FIG. 7 with a prism formed over a semiconductor die in accordance with an embodiment.
Figure 8B:
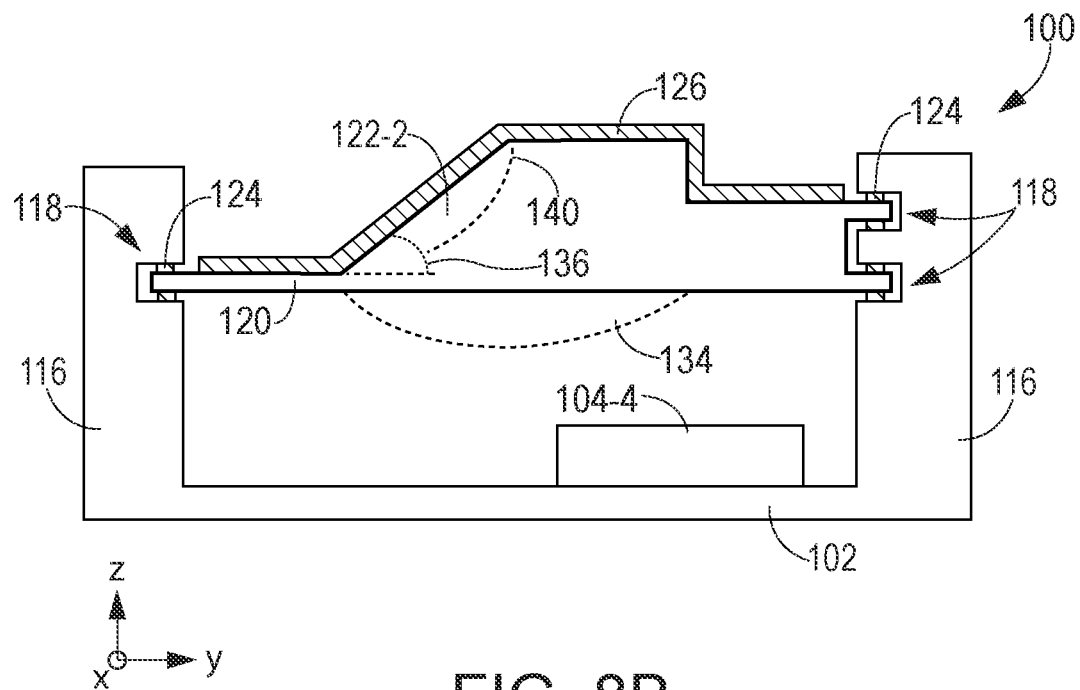

FIGS. 8A and 8B are cross-sectional side views of package 100 in FIG. 7 showing illustrative arrangements for prisms in the package. FIG. 8A is a cross-sectional side view taken along line 128 in FIG. 7.

As shown in FIG. 8A, silicon die 104-3 is mounted on package substrate 102 (sometimes referred to as package material 102 or package carrier 102). The package also includes package sidewalls 116 formed from the package material. Sidewalls 116 and substrate 102 may collectively be referred to as a carrier. The package carrier may be formed from ceramic, an organic laminate, or any other desired material. Silicon die 104-3 may be electrically connected to the package (e.g., conductive contacts in the package) using through-silicon vias, wire bonds, or any other desired techniques.

The semiconductor die 104-3 is covered by a package lid 120. The package lid 120 may be a transparent layer of glass, epoxy, or another desired material. The package lid 120 may provide a sealed environment for the underlying dice to prevent moisture and other contaminants from damaging the dice.

In this example, prisms are also integrated into the package lid. As shown in FIG. 8A, a prism 122-1 is formed in the package lid. The prism may be shaped to redirect incident light to the underlying die 104-3. The prism may be formed from the same material as the package lid and may have an index of refraction that is greater than 1.3, greater than 1.4, greater than 1.5, between 1.3 and 1.7, or any other desired value. In FIG. 8A, prism 122-1 (sometimes referred to as light redirecting structure 122-1) may include a surface that is at an angle 132 relative to the upper surface of the package lid (and the upper surface of the underlying die, sub-array, and package substrate). Angle 132 may be 45 degrees, 45 degrees or more, 45 degrees or less, etc. In general, the shape of prism 122-1 may be selected to redirect incident light to die 104-3.

An air gap may be present between the lower surface of the package lid and die 104-3. If desired, an optional light spreading feature 134 may be included on a lower surface of the package lid. Light spreading feature 134 may be a convex lens (as in FIG. 8A) and may increase the dynamic range of the SPAD array.

In FIG. 8A, the package lid 120 has protrusions (sometimes referred to as tabs) that extend into recesses 118 in package sidewalls 116. Adhesive 124 (which may be epoxy or any other desired type of adhesive) may attach the package lid to the package carrier in recesses 118.

An anti-reflective coating (ARC) 126 may be formed over the upper surface of the package lid and prism 122-1.

FIG. 8B is a cross-sectional side view taken along line 130 in FIG. 7. As shown in FIG. 8B, silicon die 104-4 is mounted on package substrate 102. Silicon die 104-4 may be electrically connected to the package (e.g., conductive contacts in the package) using through-silicon vias, wire bonds, or any other desired techniques.

Similar to as in FIG. 8A, the semiconductor die 104-4 in FIG. 8B is covered by package lid 120. As shown in FIG. 8B, a prism 122-2 is formed in the package lid. The prism 122-2 in FIG. 8B may be shaped to redirect incident light to the underlying die 104-4. The prism may be formed from the same material as the package lid and may have an index of refraction that is greater than 1.3, greater than 1.4, greater than 1.5, between 1.3 and 1.7, or any other desired value. In FIG. 8B, prism 122-2 (sometimes referred to as light redirecting structure 122-2) may include a surface that is at an angle 136 relative to the upper surface of the package lid (and the upper surface of the underlying die, sub-array, and package substrate). Angle 136 may be 45 degrees, 45 degrees or more, 45 degrees or less, etc. In general, the shape of prism 122-2 may be selected to redirect incident light to die 104-4. Angle 136 may be the same magnitude as angle 132 or a different magnitude than angle 132. In general, depending on the particular package requirements, prisms 122-1 and 122-2 may have the same structure (facing different directions) as in FIGS. 8A and 8B or may have different structures entirely.

The prism structures shown in FIGS. 8A and 8B are merely illustrative. In another possible example, the prism may have a concave surface (e.g., following profile 140 in FIG. 8B). The concave surface may help spread incident light, increasing the dynamic range of the underlying single-photon avalanche diode. Prisms 122-1 and 122-2 may both optionally have a concave surface instead of a planar surface.

An air gap may be present between the lower surface of the package lid and die 104-4. If desired, an optional light spreading feature 134 may be included on a lower surface of the package lid, similar to as discussed in connection with FIG. 8B.

An anti-reflective coating (ARC) 126 may be formed over the upper surface of the package lid and prism 122-2.

Figure 8C:
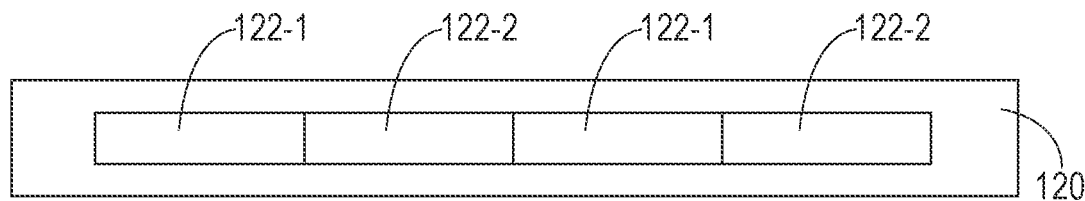
FIG. 8C is a top view of an illustrative package lid showing how prisms of different types may alternate across the package lid in accordance with an embodiment.

FIG. 8C is a top view of package 100 showing how prisms 122-1 and 122-2 may alternate on the surface of package lid 120. Each prism 122-1 alternates with a respective prism 122-2. Each prism 122-1 is configured to redirect light in the negative Y-direction (e.g., to dice 104-1 and 104-3 in FIG. 7). Each prism 122-2 is configured to redirect light in the positive Y-direction (e.g., to dice 104-2 and 104-4 in FIG. 7).

In general, the light redirecting structures 122-1 and 122-2 may be manufactured in any desired manner. In one example, the package lid may be etched to form light redirecting structures 122-1 and 122-2. In this case the package lid and prisms 122-1 and 122-2 are all formed integrally. In another possible example, the package lid may have discrete portions each etched with a respective prism. The discrete portions are then separately attached to the packaging material. In yet another possible example, the package lid and integrated prisms 122-1 and 122-2 may be injection molded. In yet another possible example, prisms may be formed separately from the package lid and attached to an upper surface of the package lid.

Figure 9:
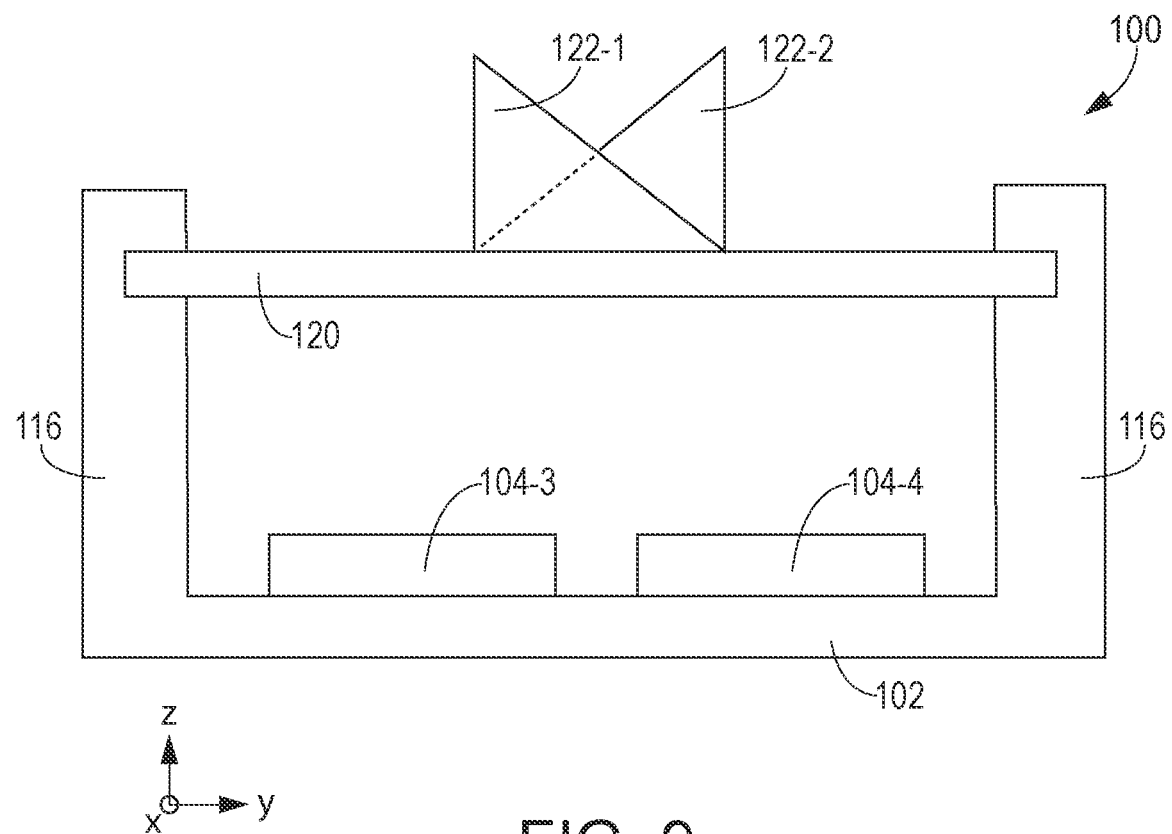
FIG. 9 is a side view of an illustrative semiconductor package with prisms attached to an upper surface of a package lid in accordance with an embodiment.

FIG. 9 is a side view of an illustrative package having prims that are attached to an upper surface of the package lid. As shown, package lid 120 is formed over the underlying dice such as die 104-3 and die 104-4. Package lid 120 is attached to recesses in package sidewall 116, similar to as in FIGS. 8A and 8B. However, instead of prisms 122-1 and 122-2 being formed integrally with package lid 120, the prisms 122-1 and 122-2 are attached to the upper surface of package lid 120. In one possible embodiment, discrete prisms may each be attached to the package lid. In another possible embodiment, multiple prisms (e.g., all of the prisms for the package) may be formed integrally and attached collectively to the upper surface of the package lid.

With an arrangement of the type shown in FIG. 9, the prisms may be formed from a different material than the package lid. The prisms may be formed from a transparent material such as glass, epoxy, or another desired material. The prisms may have an index of refraction that is greater than 1.3, greater than 1.4, greater than 1.5, between 1.3 and 1.7, or any other desired value.

In FIGS. 8A, 8B, and 9, the package lid 120 extends into recesses in the sidewalls 116 of package 100. This example is merely illustrative. In another possible embodiment, the package lid may be attached to an upper surface of the package sidewalls. In general, any desired arrangement may be used for the package lid and packaging material. Similarly, the particular structures of prisms 122-1 and 122-2 depicted herein are merely illustrative. Each prism may have any desired structure that allows light to be redirected to a corresponding semiconductor die.

The foregoing is merely illustrative and various modifications can be made by those skilled in the art. The foregoing embodiments may be implemented individually or in any combination.

What is claimed is:

1. A semiconductor package comprising:
   a package substrate that has first and second opposing sides;
   a plurality of semiconductor dice mounted on the package substrate in a staggered arrangement in which semiconductor dice are alternately positioned on the first side of the package substrate and the second side of the package substrate, wherein each one of the semiconductor dice includes at least one single-photon avalanche diode; and
   a plurality of prisms over the plurality of semiconductor dice, wherein the plurality of prisms includes a first subset of prisms that have a first structure and a second subset of prisms that have a second structure that is different than the first structure, wherein the first structure is configured to redirect light towards the first side of the package substrate, and wherein the second structure is configured to redirect light towards the second side of the package substrate.

2. The semiconductor package defined in claim 1, wherein the package substrate has a centerline and wherein the plurality of semiconductor dice includes a first subset of semiconductor dice that are positioned on a first side of the centerline and on the first side of the package substrate and a second subset of semiconductor dice that are positioned on a second side of the centerline and on the second side of the package substrate.

3. The semiconductor package defined in claim 1, wherein the single-photon avalanche diodes of the plurality of semiconductor dice collectively form a silicon photomultiplier.

4. The semiconductor package defined in claim 1, wherein the single-photon avalanche diodes of the plurality of semiconductor dice collectively form a line array having a single row and a plurality of columns.

5. The semiconductor package defined in claim 2, wherein each semiconductor die has a length that extends parallel to the centerline.

6. The semiconductor package defined in claim 1, further comprising:
a package lid, wherein the plurality of prisms are attached to the package lid.

7. The semiconductor package defined in claim 1, further comprising:
a package lid, wherein the plurality of prisms are part of the package lid.

8. The semiconductor package defined in claim 1, further comprising:
package sidewalls; and
a package lid, wherein the package sidewalls include recesses that receive portions of the package lid.

9. The semiconductor package defined in claim 1, further comprising:
an anti-reflective coating that is over the plurality of prisms.

10. The semiconductor package defined in claim 2, wherein the first structure overlaps the second side of the package substrate and is configured to redirect light to the first side of the package substrate and wherein the second structure overlaps the first side of the package substrate and is configured to redirect light to the second side of the package substrate.

11. The semiconductor package defined in claim 1, wherein the first structure includes a first top surface and a first angled surface that is non-parallel and non-orthogonal to the first top surface.

12. The semiconductor package defined in claim 11, wherein the second structure includes a second top surface and a second angled surface that is non-parallel and non-orthogonal to the second top surface and wherein the first and second angled surfaces are non-parallel.

13. A semiconductor package comprising:
a package substrate;
a plurality of semiconductor dice mounted on the package substrate in a staggered arrangement, wherein each one of the semiconductor dice includes at least one single-photon avalanche diode; and
a plurality of light redirecting structures over the plurality of semiconductor dice; and
light spreading features, wherein each light spreading feature is positioned below a respective light redirecting structure of the plurality of light redirecting structures.

14. The semiconductor package defined in claim 13, wherein the plurality of light redirecting structures includes a first subset of light redirecting structures that have a first structure and a second subset of light redirecting structures that have a second structure that is different than the first structure, wherein the first structure is configured to redirect light towards a first side of the package substrate, and wherein the second structure is configured to redirect light towards a second side of the package substrate.

15. The semiconductor package defined in claim 13, wherein the light spreading features comprise convex lenses.

16. A semiconductor package comprising:
a package substrate that has first and second opposing sides;
a first semiconductor die mounted to the first side of the package substrate that includes a first plurality of single-photon avalanche diodes arranged in a first line;
a second semiconductor die mounted to the second side of the package substrate that includes a second plurality of single-photon avalanche diodes arranged in a second line;
a first prism that is configured to redirect incident light towards the first semiconductor die; and
a second prism that is configured to redirect incident light towards the second semiconductor die.

17. The semiconductor package defined in claim 16, wherein the first and second lines are parallel and extend in a first direction and wherein the first and second semiconductor dice overlap in a second direction that is orthogonal to the first direction.

18. The semiconductor package defined in claim 16, wherein the first prism has a concave surface that is configured to spread the incident light.

* * * * *